United States Patent [19]
Ross

[11] Patent Number: 6,101,115
[45] Date of Patent: Aug. 8, 2000

[54] CAM MATCH LINE PRECHARGE

[75] Inventor: Mark Ross, San Carlos, Calif.

[73] Assignee: Cisco Technology, Inc., San Jose, Calif.

[21] Appl. No.: 09/130,747

[22] Filed: Aug. 7, 1998

[51] Int. Cl.[7] .............................. G11C 15/00; G11C 7/00
[52] U.S. Cl. ............................ 365/49; 365/168; 365/203
[58] Field of Search ............................... 365/49, 168, 203

[56] References Cited

U.S. PATENT DOCUMENTS

| Re. 33,900 | 4/1992 | Howson . |
|---|---|---|
| 4,131,767 | 12/1978 | Weinstein . |
| 4,161,719 | 7/1979 | Parikh et al. . |
| 4,316,284 | 2/1982 | Howson . |
| 4,397,020 | 8/1983 | Howson . |
| 4,419,728 | 12/1983 | Larson . |

(List continued on next page.)

FOREIGN PATENT DOCUMENTS

| 0 384 758 A2 | 8/1990 | Japan . |
|---|---|---|
| 0 431 751 A1 | 6/1991 | Japan . |
| 0 567 217 A2 | 10/1993 | Japan . |
| WO93/07569 | 4/1993 | WIPO . |
| WO93/07692 | 4/1993 | WIPO . |
| WO94/01828 | 1/1994 | WIPO . |
| WO95/20850 | 8/1995 | WIPO . |

OTHER PUBLICATIONS

Allen, M., "Novell IPX Over Various WAN Media (IPXWAN)," Network Working Group, RFC 1551, Dec. 1993, pp. 1–22.

Becker, D., "3c589.c: A 3c589 EtherLink3 ethernet driver for linux," becker@CESDIS.gsfc.nasa.gov, May 3, 1994, pp. 1–13.

Chowdhury, et al., "Alternative Bandwidth Allocation Algorithms for Packet Video in ATM Networks," INFOCOM 1992, pp. 1061–1068.

Doeringer, W., "Routing on Longest–Matching Prefixes," IEEE/ACM Transactions in Networking, vol. 4, No. 1, Feb. 1996, pp. 86–97.

Esaki, et al., "Datagram Delivery in an ATM–Internet," 2334b IEICE Transactions on Communications, Mar. 1994, No. 3, Tokyo, Japan.

IBM Corporation, "Method and Apparatus for the Statistical Multiplexing of Voice, Data and Image Signals," IBM Technical Disclosure Bulletin, No. 6, Nov. 1992, pp. 409–411.

Pei, et al., "Putting Routing Tables in Silicon," IEEE Network Magazine, Jan. 1992, pp. 42–50.

Perkins, D., "Requirements for an Internet Standard Point–to–Point Protocol," Network Working Group, RFC 1547, Dec. 1993, pp. 1–19.

Simpson, W., "The Point–to–Point Protocol (PPP)," Network Working Group, RFC 1548, Dec. 1993, pp. 1–53.

Tsuchiya, P.F., "A Search Algorithm for Table Entries with Non–Contiguous Wildcarding," Abstract, Bellcore.

Zhang, et al., "Rate–Controlled Static–Priority Queueing," INFOCOM 1993, pp. 227–236.

*Primary Examiner*—Trong Phan
*Attorney, Agent, or Firm*—Swernofsky Law Group

[57] ABSTRACT

The invention provides a method and system for improved CAM match line precharge, in which the amount of power consumed by match line precharge and discharge is significantly reduced. An independent match precharge voltage is introduced to the CAM, which is used to separately precharge the match line and is available for use by comparison circuits to attempt to match the input tag. The match precharge voltage is selected so as to reduce the relative power consumption for match line precharge and discharge by a factor of about five. Optionally, sense amplifiers in the comparison circuits are disposed so as to compare each discharged match line with the match precharge voltage itself.

39 Claims, 1 Drawing Sheet

U.S. PATENT DOCUMENTS

| | | |
|---|---|---|
| 4,424,565 | 1/1984 | Larson . |
| 4,437,087 | 3/1984 | Petr . |
| 4,438,511 | 3/1984 | Baran . |
| 4,439,763 | 3/1984 | Limb . |
| 4,445,213 | 4/1984 | Baugh et al. . |
| 4,446,555 | 5/1984 | Devault et al. . |
| 4,456,957 | 6/1984 | Schieltz . |
| 4,464,658 | 8/1984 | Thelen . |
| 4,499,576 | 2/1985 | Fraser . |
| 4,506,358 | 3/1985 | Montgomery . |
| 4,507,760 | 3/1985 | Fraser . |
| 4,532,626 | 7/1985 | Flores et al. . |
| 4,644,532 | 2/1987 | George et al. . |
| 4,646,287 | 2/1987 | Larson et al. . |
| 4,677,423 | 6/1987 | Benvenuto et al. . |
| 4,679,189 | 7/1987 | Olson et al. . |
| 4,679,227 | 7/1987 | Hughes-Hartogs . |
| 4,723,267 | 2/1988 | Jones et al. . |
| 4,731,816 | 3/1988 | Hughes-Hartogs . |
| 4,750,136 | 6/1988 | Arpin et al. . |
| 4,757,495 | 7/1988 | Decker et al. . |
| 4,763,191 | 8/1988 | Gordon et al. . |
| 4,769,810 | 9/1988 | Eckberg, Jr. et al. . |
| 4,769,811 | 9/1988 | Eckberg, Jr. et al. . |
| 4,771,425 | 9/1988 | Baran et al. . |
| 4,819,228 | 4/1989 | Baran et al. . |
| 4,827,411 | 5/1989 | Arrowood et al. . |
| 4,833,706 | 5/1989 | Hughes-Hartogs . |
| 4,835,737 | 5/1989 | Herrig et al. . |
| 4,879,551 | 11/1989 | Georgiou et al. . |
| 4,893,306 | 1/1990 | Chao et al. . |
| 4,903,261 | 2/1990 | Baran et al. . |
| 4,922,486 | 5/1990 | Lidinsky et al. . |
| 4,933,937 | 6/1990 | Konishi . |
| 4,960,310 | 10/1990 | Cushing . |
| 4,962,497 | 10/1990 | Ferenc et al. . |
| 4,962,532 | 10/1990 | Kasirai et al. . |
| 4,965,767 | 10/1990 | Kinoshita et al. ................. 365/49 |
| 4,965,772 | 10/1990 | Daniel et al. . |
| 4,970,678 | 11/1990 | Sladowski et al. . |
| 4,980,897 | 12/1990 | Decker et al. . |
| 4,991,169 | 2/1991 | Davis et al. . |
| 5,003,595 | 3/1991 | Collins et al. . |
| 5,014,265 | 5/1991 | Hahne et al. . |
| 5,020,058 | 5/1991 | Holden et al. . |
| 5,033,076 | 7/1991 | Jones et al. . |
| 5,034,919 | 7/1991 | Sasai et al. ................. 365/49 |
| 5,054,034 | 10/1991 | Hughes-Hartogs . |
| 5,059,925 | 10/1991 | Weisbloom . |
| 5,072,449 | 12/1991 | Enns et al. . |
| 5,088,032 | 2/1992 | Bosack . |
| 5,095,480 | 3/1992 | Fenner . |
| 5,115,431 | 5/1992 | Williams et al. . |
| 5,128,945 | 7/1992 | Enns et al. . |
| 5,136,580 | 8/1992 | Videlock et al. . |
| 5,166,930 | 11/1992 | Braff et al. . |
| 5,199,049 | 3/1993 | Wilson . |
| 5,206,886 | 4/1993 | Bingham . |
| 5,208,811 | 5/1993 | Kashio et al. . |
| 5,212,686 | 5/1993 | Joy et al. . |
| 5,224,099 | 6/1993 | Corbalis et al. . |
| 5,226,120 | 7/1993 | Brown et al. . |
| 5,228,062 | 7/1993 | Bingham . |
| 5,229,994 | 7/1993 | Balzano et al. . |
| 5,237,564 | 8/1993 | Lespagnol et al. . |
| 5,241,682 | 8/1993 | Bryant et al. . |
| 5,243,342 | 9/1993 | Kattemalalavadi et al. . |
| 5,243,596 | 9/1993 | Port et al. . |
| 5,247,516 | 9/1993 | Bernstein et al. . |
| 5,249,178 | 9/1993 | Kurano et al. . |
| 5,253,251 | 10/1993 | Aramaki . |
| 5,255,291 | 10/1993 | Holden et al. . |
| 5,260,933 | 11/1993 | Rouse . |
| 5,260,978 | 11/1993 | Fleischer et al. . |
| 5,268,592 | 12/1993 | Bellamy et al. . |
| 5,268,900 | 12/1993 | Hluchyj et al. . |
| 5,271,004 | 12/1993 | Proctor et al. . |
| 5,274,631 | 12/1993 | Bhardwaj . |
| 5,274,635 | 12/1993 | Rahman et al. . |
| 5,274,643 | 12/1993 | Fisk . |
| 5,280,470 | 1/1994 | Buhrke et al. . |
| 5,280,480 | 1/1994 | Pitt et al. . |
| 5,280,500 | 1/1994 | Mazzola et al. . |
| 5,283,783 | 2/1994 | Nguyen et al. . |
| 5,287,103 | 2/1994 | Kasprzyk et al. . |
| 5,287,453 | 2/1994 | Roberts . |
| 5,291,482 | 3/1994 | McHarg et al. . |
| 5,305,311 | 4/1994 | Lyles . |
| 5,307,343 | 4/1994 | Bostica et al. . |
| 5,311,509 | 5/1994 | Heddes et al. . |
| 5,313,454 | 5/1994 | Bustini et al. . |
| 5,313,582 | 5/1994 | Hendel et al. . |
| 5,317,562 | 5/1994 | Nardin et al. . |
| 5,319,644 | 6/1994 | Liang . |
| 5,327,421 | 7/1994 | Hiller et al. . |
| 5,331,637 | 7/1994 | Francis et al. . |
| 5,345,445 | 9/1994 | Hiller et al. . |
| 5,345,446 | 9/1994 | Hiller et al. . |
| 5,359,592 | 10/1994 | Corbalis et al. . |
| 5,361,250 | 11/1994 | Nguyen et al. . |
| 5,361,256 | 11/1994 | Doeringer et al. . |
| 5,361,259 | 11/1994 | Hunt et al. . |
| 5,365,524 | 11/1994 | Hiller et al. . |
| 5,367,517 | 11/1994 | Cidon et al. . |
| 5,371,852 | 12/1994 | Attanasio et al. . |
| 5,386,567 | 1/1995 | Lien et al. . |
| 5,390,170 | 2/1995 | Sawant et al. . |
| 5,390,175 | 2/1995 | Hiller et al. . |
| 5,394,394 | 2/1995 | Crowther et al. . |
| 5,394,402 | 2/1995 | Ross . |
| 5,400,325 | 3/1995 | Chatwani et al. . |
| 5,408,469 | 4/1995 | Opher et al. . |
| 5,416,842 | 5/1995 | Aziz . |
| 5,422,880 | 6/1995 | Heitkamp et al. . |
| 5,422,882 | 6/1995 | Hiller et al. . |
| 5,423,002 | 6/1995 | Hart . |
| 5,426,636 | 6/1995 | Hiller et al. . |
| 5,428,607 | 6/1995 | Hiller et al. . |
| 5,430,715 | 7/1995 | Corbalis et al. . |
| 5,442,457 | 8/1995 | Najafi . |
| 5,442,630 | 8/1995 | Gagliardi et al. . |
| 5,452,297 | 9/1995 | Hiller et al. . |
| 5,473,599 | 12/1995 | Li et al. . |
| 5,473,607 | 12/1995 | Hausman et al. . |
| 5,477,541 | 12/1995 | White et al. . |
| 5,485,455 | 1/1996 | Dobbins et al. . |
| 5,490,140 | 2/1996 | Abensour et al. . |
| 5,490,258 | 2/1996 | Fenner . |
| 5,491,687 | 2/1996 | Christensen et al. . |
| 5,491,804 | 2/1996 | Heath et al. . |
| 5,497,368 | 3/1996 | Reijnierse et al. . |
| 5,504,747 | 4/1996 | Sweasey . |
| 5,509,006 | 4/1996 | Wilford et al. . |
| 5,517,494 | 5/1996 | Green . |
| 5,519,704 | 5/1996 | Farinacci et al. . |
| 5,526,489 | 6/1996 | Nilakantan et al. . |
| 5,530,963 | 6/1996 | Moore et al. . |
| 5,535,195 | 7/1996 | Lee . |
| 5,539,734 | 7/1996 | Burwell et al. . |
| 5,555,244 | 9/1996 | Gupta et al. . |
| 5,561,669 | 10/1996 | Lenney et al. . |
| 5,583,862 | 12/1996 | Callon . |

| | | |
|---|---|---|
| 5,592,470 | 1/1997 | Rudrapatna et al. . |
| 5,598,581 | 1/1997 | Daines et al. . |
| 5,600,798 | 2/1997 | Cherukuri et al. . |
| 5,602,770 | 2/1997 | Ohira ................................... 365/49 |
| 5,604,868 | 2/1997 | Komine et al. . |
| 5,608,726 | 3/1997 | Virgile . |
| 5,617,417 | 4/1997 | Sathe et al. . |
| 5,617,421 | 4/1997 | Chin et al. . |
| 5,630,125 | 5/1997 | Zellweger . |
| 5,631,908 | 5/1997 | Saxe . |
| 5,632,021 | 5/1997 | Jennings et al. . |
| 5,634,010 | 5/1997 | Ciscon et al. . |
| 5,638,359 | 6/1997 | Peltola et al. . |
| 5,644,718 | 7/1997 | Belove et al. . |
| 5,659,684 | 8/1997 | Giovannoni et al. . |
| 5,666,353 | 9/1997 | Klausmeier et al. . |
| 5,673,265 | 9/1997 | Gupta et al. . |
| 5,678,006 | 10/1997 | Valizadeh et al. . |
| 5,684,797 | 11/1997 | Aznar et al. . |
| 5,687,324 | 11/1997 | Green et al. . |
| 5,689,506 | 11/1997 | Chiussi et al. . |
| 5,694,390 | 12/1997 | Yamato et al. . |
| 5,724,351 | 3/1998 | Chao et al. . |
| 5,740,097 | 4/1998 | Satoh ................................... 365/49 |
| 5,748,186 | 5/1998 | Raman . |
| 5,748,617 | 5/1998 | McLain, Jr. . |
| 5,754,547 | 5/1998 | Nakazawa . |
| 5,835,710 | 11/1998 | Nagami et al. . |
| 5,841,874 | 11/1998 | Kempke et al. ................... 365/168 |
| 5,854,903 | 12/1998 | Morrison et al. . |
| 5,898,686 | 4/1999 | Virgile . |

CAM MATCH LINE PRECHARGE

BACKGROUND OF THE INVENTION

1. Field of the Invention

This invention relates to CAM match line precharge.

2. Related Art

A CAM (content addressable memory) is sometimes used in a computer system or device for storing and retrieving information. CAMs have the advantage that they can rapidly link associated data with known tags; it is thus possible to perform rapid lookup of the associated data once the tag is known. Known CAMs include comparison circuits for matching an input tag with each tag recorded in the CAM, so as to determine which if any of the row or lines in the CAM matches the tag.

In some known CAMs each row or line includes a set of memory cells, each of which includes a recorded match bit for comparison with the input tag. The comparison circuits operate by precharging a match line and coupling that match line to circuits for all the recorded match bits. If any recorded match bit is not the same as the input tag, the match line is discharged. Thus, most match lines are discharged, even though the CAM does not deliver the data associated with the unmatched tag.

One problem in the known art is that power consumption from precharging and discharging the match line is relatively high. This problem is exacerbated when the CAM is relatively large, that is, when the number of bits to be matched in the tag is relatively large. In addition to the amount of power consumed by precharge and discharge of the match line, the process of precharging and discharging the match line can be time consuming relative to the total time for the CAM to respond to the input tag. It would be advantageous to reduce both the relative amount of power consumption and the relative time required for operation of the CAM.

Accordingly, it would be desirable to provide a method and system for improved CAM match line precharge. This advantage is achieved in an embodiment of the invention in which the amount of power consumed by match line precharge and discharge is significantly reduced by use of a relatively lower discharge voltage. This has two further advantages: (1) discharging from a lower voltage is relatively faster, and (2) use of the lower voltage as an input to the sense amplifier speeds up comparisons.

SUMMARY OF THE INVENTION

The invention provides a method and system for improved CAM match line precharge, in which the amount of power consumed by match line precharge and discharge is significantly reduced. An independent match precharge voltage is introduced to the CAM, which is used to separately precharge the match line and is available for use by comparison circuits to attempt to match the input tag. In a preferred embodiment, the match precharge voltage is selected so as to reduce the relative power consumption for match line precharge and discharge by a factor of about five.

In a preferred embodiment, sense amplifiers in the comparison circuits are disposed so as to compare each discharged match line with the match precharge voltage itself, or to take advantage of the lower signal swing to speed up single-ended sensing schemes.

BRIEF DESCRIPTION OF THE DRAWINGS

The figure shows a block diagram of an improved system for CAM match line precharge.

DETAILED DESCRIPTION OF THE PREFERRED EMBODIMENT

Figure 1:
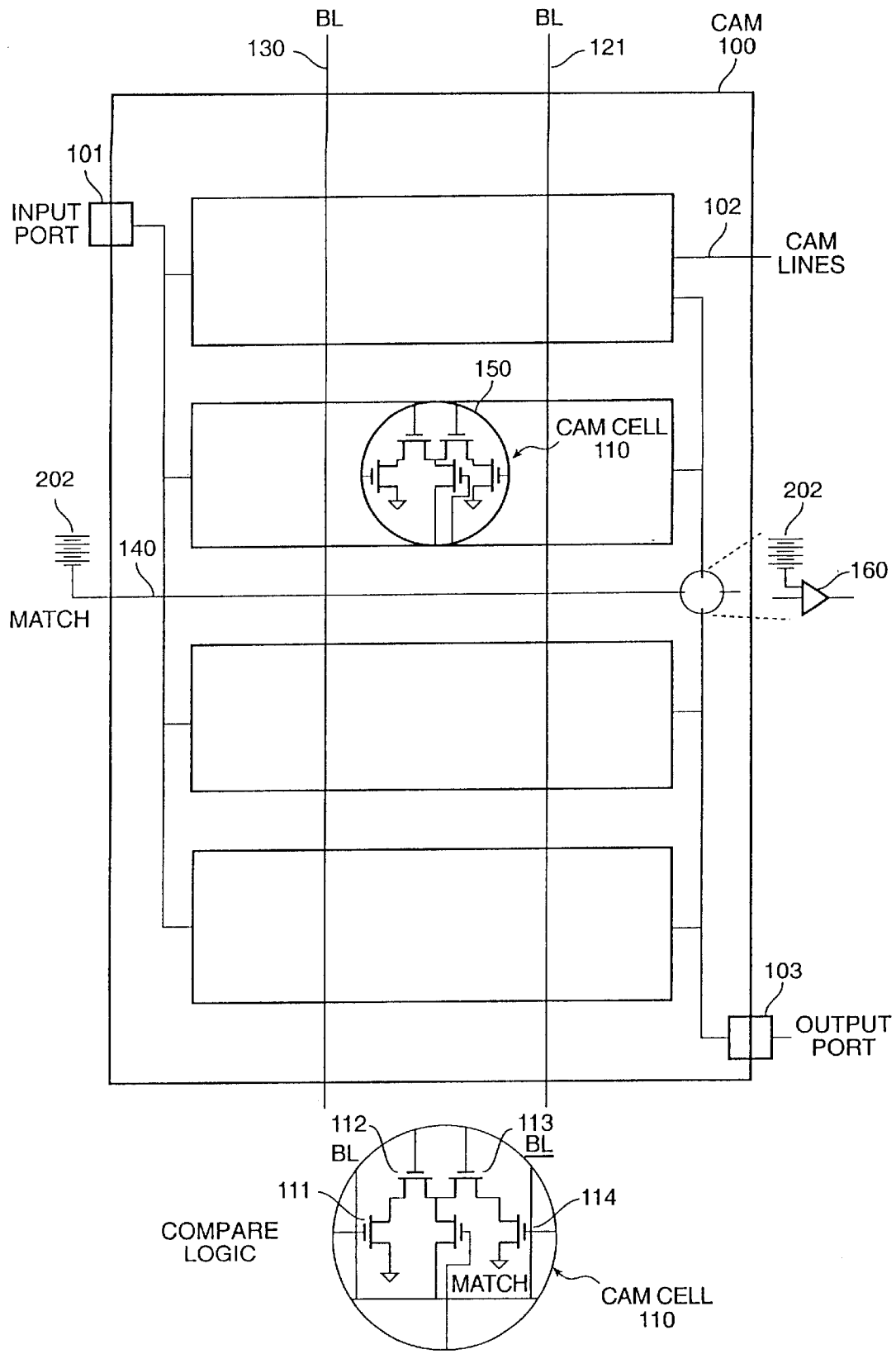

In the following description, a preferred embodiment of the invention is described with regard to preferred process steps and data structure would recognize after perusal of this application that embodiments of the invention can be implemented using circuits adapted to particular process steps and data structures described herein, and that implementation of the process herein would not require undue experimentation or further invention.

System Elements

The figure shows a block diagram of an improved system for CAM match line precharge.

Operation of CAM

A CAM 100 includes an input port 101, a plurality of CAM lines 102, and an output port 103. Each one CAM line 102 is disposed to match an input value from the input port 101 to a tag value recorded at the CAM line 102, and to output a logical match bit indicating whether the input value is equal to the tag value. An accumulator (not shown) collects the logical match bits and selects at least one stored value associated with the one tag value that matches the input value. In an ordinary binary CAM, there will be one such matched stored value, while in a ternary CAM, there can be multiple such matched stored values.

Each CAM line 102 includes a plurality of CAM cells 120, one for each bit of the tag value. Each CAM cell is coupled to a bit line 130 BL (and an inverted bit line 121 BL-bar), and to a match line 140 MATCH. In alternative embodiments, the CAM cells 120 may be coupled to independent compare lines.

Each CAM cell 110 includes a set of four transistors Q1, Q2, Q3, Q4 respectively shown in FIG. 1 as 111, 112, 113, 114, that collectively form, for all CAM cells 110 in a CAM line 102, a wired-XNOR circuit 150. The wired-XNOR circuit 150 thus has a plurality of inputs (one for each CAM cell 110), and a single output (not shown). Each input is responsive to whether the single CAM cell 110 matches the input value for the CAM 110 to the tag value for that CAM line 102.

Although a preferred embodiment uses a four-transistor wired-XNOR circuit 150, those skilled in the art will recognize, after perusal of this application, that many other alternatives are possible that can achieve the same or a similar result, and that such alternatives would not require further invention or undue experimentation. Such alternatives are within the scope and spirit of the invention.

In a preferred embodiment, the wired-XNOR circuit 150 is coupled to the match line 140 MATCH. The match line 140 MATCH is precharged with a match line voltage, and the bit line 130 BL (and the inverted bit line 121 BL-bar) are enabled for those bits of the input value that are logical "1." The wired-XNOR circuit 150 discharges the match line 140 MATCH at each CAM cell 110 for those bits of the input value that do not match the corresponding bit of the tag value at that CAM cell 110. If any bit of the wired-XNOR circuit 150 discharges the match line 140 MATCH, the match line 140 MATCH discharges and presents a logical "0" for the output of the wired-XNOR circuit 150.

Thus, the amount of power consumed by precharging and discharging the match lines 140 MATCH is given by equation 201:

$$P = nCv^2 f \qquad (201)$$

where

P=power consumed,
n=number of match lines,
C=capacitance of each match line,
v=voltage swing for each match line, and
f=frequency of CAM operations.

A sense amplifier 160 is coupled to each match line 140 MATCH, and is disposed for comparing a voltage for the match line 140 MATCH with a threshold voltage. An input value that is nearly equal to the tag value for will cause the match line 140 MATCH to discharge nearly, but not entirely. The sense amplifier 160 is sensitive to slight changes in the voltage on the match line 140 MATCH.

Match Precharge Voltage

An independent match line precharge voltage (IMPV) 202 is coupled to each match line 140 MATCH to precharge the match line 140 MATCH. In a preferred embodiment, the IMPV 202 is supplied to the CAM 100 from an external source.

As shown above in equation 201, the power consumption of the CAM 100 is proportional to (IMPV)$^2$. In a first preferred embodiment, the expected operating voltage of the CAM 100 is about 2.5 volts, and the (IMPV) 202 is selected to be substantially less, such as about 1.8 volts. In a second preferred embodiment, the expected operating voltage of the CAM 100 is about 1.8 volts, and the (IMPV) 202 is selected to be substantially less, such as about 1.0 volts. In either case, power consumption is substantially less than if the operating voltage of the CAM 100 were used instead of the (IMPV) 202.

Those skilled in the art will recognize, after perusal of this application, that power consumption using the (IMPV) 202 is about 20% to about 50% of when using the operating voltage as the match precharge voltage.

The (IMPV) 202 may be coupled to each sense amplifier 160 for use as the selected threshold voltage. This promotes recognition of relatively small voltage changes in each match line 140 MATCH. In a preferred embodiment, the (IMPV) 202 is selected so as to provide a sufficient noise margin at the sense amplifier 160, so that the noise margin is above the switching point of a single-ended sense amplifier 160.

Application to CAM Design

Those skilled in the art will recognize, after perusal of this application, that the invention is well suited for use in different types of CAM, including both binary CAMs and ternary CAMs.

In a ternary CAM, each CAM cell 110 includes both a tag value and a mask value. The mask value determine whether the input value for the CAM 100 includes bits for which matching is not attempted, that is, for which the CAM cell 110 is considered to match the input value regardless of the actual corresponding tag value bit.

In a CAM, it is expected that a majority of the CAM cells 110 will not match regardless of the actual corresponding tag value bit. Accordingly, it would be advantageous to reduce power consumption in a ternary CAM.

Alternative Embodiments

Although preferred embodiments are disclosed herein, many variations are possible which remain within the concept, scope, and spirit of the invention, and these variations would become clear to those skilled in the art after perusal of this application.

I claim:

1. An independent match-line precharge voltage within a content addressable memory, including
   an input port disposed for receiving a selected match precharge voltage substantially independent of an operating voltage of said memory;
   wherein said selected match precharge voltage provide for relatively lower power consumption of said memory when said selected match precharge voltage is substantially less than said operating voltage.

2. A memory as in claim 1, wherein said memory includes a mask value for at least some lines of said memory.

3. A memory as in claim 1, wherein said memory includes a ternary content addressable memory.

4. A memory as in claim 1, wherein said power consumption is between about 20% to about 50% of that for a match precharge voltage greater than about 2.00 volts.

5. A memory as in claim 1, wherein said power consumption is between about 20% to about 50% of that for a match precharge voltage substantially equal to said operating voltage.

6. A memory as in claim 1, wherein said selected match precharge voltage is about 1.8 volts.

7. A memory as in claim 1, wherein said selected match precharge voltage is about 1.0 volt.

8. A memory as in claim 1, wherein said selected match precharge voltage is less than about 2.0 volts.

9. A memory as in claim 1, including a sense amplifier; wherein said selected precharge voltage provides a noise margin substantially above a switching point for said sense amplifier.

10. An independent match line precharge voltage within a content addressable memory, including
    an input port disposed for receiving a selected match precharge voltage substantially independent of an operating voltage of said memory;
    a set of sense amplifiers each coupled to at least one match line of said memory, each said sense amplifier being responsive to said selected match precharge voltage.

11. A memory as in claim 10, wherein said memory includes a mask value for at least some lines of said memory.

12. A memory as in claim 10, wherein said memory includes a ternary content addressable memory.

13. A memory as in claim 10, wherein said power consumption is between about 20% to about 50% of that for a match precharge voltage greater 2.0 volts.

14. A memory as in claim 10, wherein said power consumption is between about 20% to about 50% of that for a match precharge voltage substantially equal to said operating voltage.

15. A memory as in claim 10, wherein said selected match precharge voltage is about 1.8 volts.

16. A memory as in claim 10, wherein said selected match precharge voltage is about 1.0 volt.

17. A memory as in claim 10, wherein said selected match precharge voltage is less than about 2.0 volts.

18. A memory as in claim 10, including a sense amplifier; wherein said selected precharge voltage provides a noise margin substantially above a switching point for said sense amplifier.

19. An independent match-line precharge voltage within a content addressable memory, including
    an input port disposed for receiving a selected match precharge voltage substantially independent of an operating voltage of said memory;

a set of sense amplifiers each coupled to at least one match line of said memory, each said sense amplifier being responsive to said selected match precharge voltage;

wherein said selected match precharge voltage provides for relatively lower power consumption of said memory when said selected match precharge voltage is substantially less than said operating voltage.

20. A memory as in claim 19, wherein said memory includes a mask value for at least some lines of said memory.

21. A memory as in claim 19, wherein said memory includes a ternary content addressable memory.

22. A memory as in claim 19, wherein said power consumption is between about 20% to about 50% of that for a match precharge voltage greater than about 2.0 volts.

23. A memory as in claim 19, wherein said power consumption is between about 20% to about 50% of that for a match precharge voltage substantially equal to said operating voltage.

24. A memory as in claim 19, wherein said selected match precharge voltage is about 1.8 volts.

25. A memory as in claim 19, wherein said selected match precharge voltage is about 1.0 volt.

26. A memory as in claim 19, wherein said selected match precharge voltage is less than about 2.0 volts.

27. A memory as in claim 19, wherein said selected precharge voltage provides a noise margin substantially above a switching point for said set of sense amplifiers.

28. A method of operating a content addressable memory, said method including steps for receiving a selected match precharge voltage substantially independent of an operating voltage of said memory; and consuming relatively lower power during operating of said memory responsive to said selected match precharge voltage, when said selected match precharge voltage is substantially less than said operating voltage.

29. A method as in claim 28, including steps for matching, for at least some lines of said memory, an input value for said memory against a mask value.

30. A method as in claim 28, wherein said power consumption is between about 20% to about 50% of that for a match precharge voltage greater than about 2.0 volts.

31. A method as in claim 28, wherein said power consumption is between about 20% to about 50% of that for a match precharge voltage substantially equal to said operating voltage.

32. A method of operating a content addressable memory, said method including steps for receiving a selected match precharge voltage substantially independent of an operating voltage of said memory; and matching at least one match line of said memory responsive to selected match precharge voltage.

33. A method as in claim 32, including steps for matching, for at least some lines of said memory, an input value for said memory against a mask value.

34. A method as in claim 32, wherein said power consumption is between about 20% to about 50% of that for a match precharge voltage greater than about 2.0 volts.

35. A method as in claim 32, wherein said power consumption is between about 20% to about 50% of that for a match precharge voltage substantially equal to said operating voltage.

36. A method of operating a content addressable memory, said method including steps for receiving a selected match precharge voltage substantially independent of an operating voltage of said memory; and matching at least one match line of said memory responsive to selected match precharge voltage;

consuming relatively lower power during operating of said memory responsive to said selected match precharge voltage, when said selected match precharge voltage is substantially less than said operating voltage.

37. A method as in claim 36, including steps for matching, for at least some lines of said memory, an input value for said memory against a mask value.

38. A method as in claim 36, wherein said power consumption is between about 20% to about 50% of that for a match precharge voltage greater 2.0 volts.

39. A method as in claim 36, wherein said power consumption is between about 20% to about 50% of that for a match precharge voltage substantially equal to said operating voltage.

* * * * *